(12) United States Patent
van Asselt et al.

(10) Patent No.: US 8,039,808 B2
(45) Date of Patent: Oct. 18, 2011

(54) PERFORMANCE SOLID STATE DETECTORS

(75) Inventors: Rob van Asselt, Valkenswaard (NL); Frans H. M. Sanders, Eindoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 99 days.

(21) Appl. No.: 12/065,904

(22) PCT Filed: Aug. 18, 2006

(86) PCT No.: PCT/IB2006/052868
§ 371 (c)(1),
(2), (4) Date: Mar. 6, 2008

(87) PCT Pub. No.: WO2007/031886
PCT Pub. Date: Mar. 22, 2007

(65) Prior Publication Data
US 2008/0245967 A1 Oct. 9, 2008

Related U.S. Application Data

(60) Provisional application No. 60/596,314, filed on Sep. 15, 2005.

(51) Int. Cl.
*H01L 27/146* (2006.01)
(52) U.S. Cl. .................................. 250/370.09
(58) Field of Classification Search ............ 250/370.01–370.15; 378/98.8
See application file for complete search history.

(56) References Cited

U.S. PATENT DOCUMENTS

| | | | |
|---|---|---|---|
| 6,175,120 B1* | 1/2001 | McGregor et al. | 250/370.13 |
| 6,524,966 B1 | 2/2003 | Wright et al. | |
| 2003/0034537 A1* | 2/2003 | Shigenaka et al. | 257/442 |
| 2003/0071221 A1 | 4/2003 | Mitra | |
| 2005/0230627 A1* | 10/2005 | Protic et al. | 250/370.01 |
| 2005/0236575 A1* | 10/2005 | Petroz | 250/370.09 |

FOREIGN PATENT DOCUMENTS

| | | |
|---|---|---|
| EP | 0279248 A1 | 8/1988 |
| FR | 2849272 A1 * | 6/2004 |
| JP | 63047988 | 2/1988 |
| JP | 03175682 | 7/1991 |
| JP | 04313267 | 11/1992 |
| JP | 07079008 | 3/1995 |
| JP | 2002170916 A * | 6/2002 |
| WO | 03088368 A2 | 10/2003 |

OTHER PUBLICATIONS

Brunett et al., "Low-Cost Cadmium Zinc Telluride Radiation Detectors Based on Electron-Transport-only Designs," 1999, Sandia Report, pp. 1-70.*

(Continued)

*Primary Examiner* — Kiho Kim

(57) ABSTRACT

An imaging detector is formed from a conversion material and electrodes that are separated by trenches formed in the conversion material. The trenches increase the distance of the conductance path between electrodes or accommodate a grid of electrodes, thereby reducing current leakage between electrodes. In some embodiments, a passivation layer is used to provide improved adhesion of the electrodes to the conversion material or to shield the electrodes from grid electrode structures.

28 Claims, 12 Drawing Sheets

OTHER PUBLICATIONS

Bolotnikov, A.E., et al., "Properties of Pt Schottky Type Contacts on High-Resistivity of CdZnTe Detectors," CA Institute of Technology.

Bolotnikov, A.E., et al., "Charge Loss Between Contacts of CdZnTe Pixel Detectors," Space Radiation Laboratory, CA Institute of Technology.

Bolotnikov, A.E., et al., "Effects of Bulk and Surface Conductivity on the Performance of CdZnTe Pixel Detectors," IEEE Trans. on NU Science, 49(4) Aug. 2002.

Mescher, M.J. et al., "Development of Dry Processing Techniques for CdZnTe Surface Passivation," Journal of Electronic Materials, 28(6), 1999.

* cited by examiner

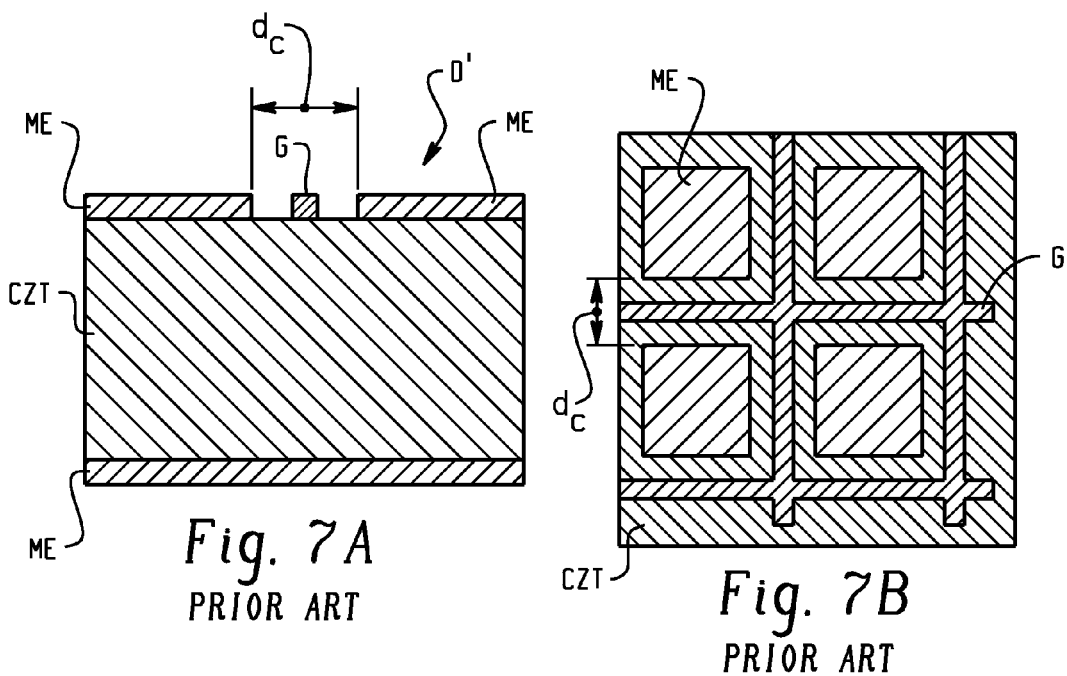
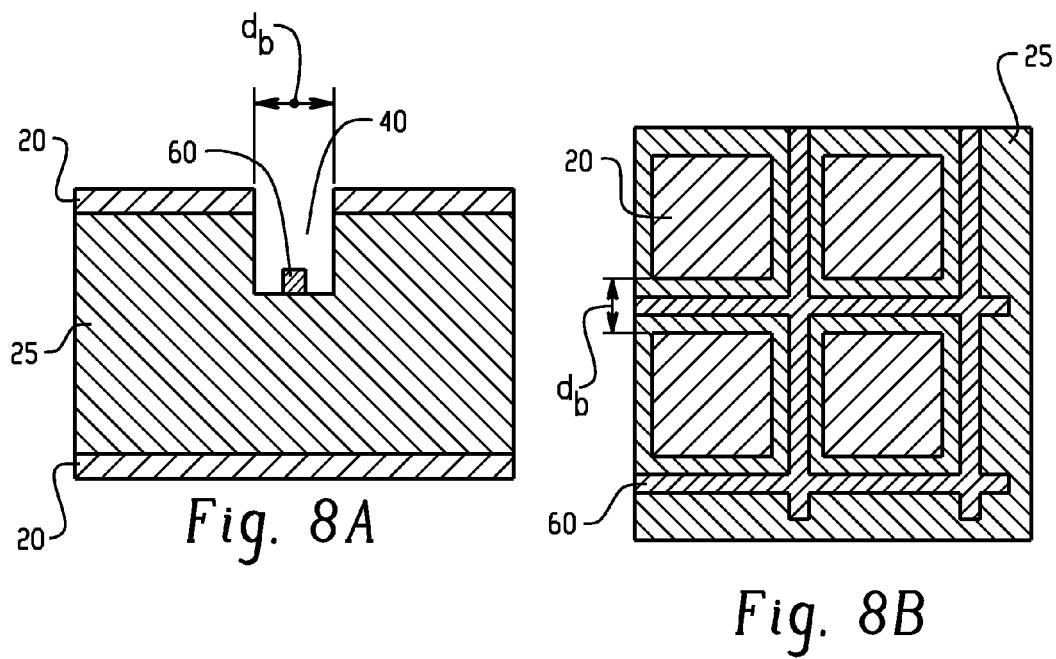

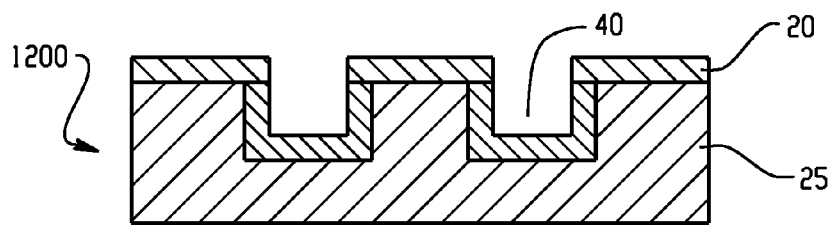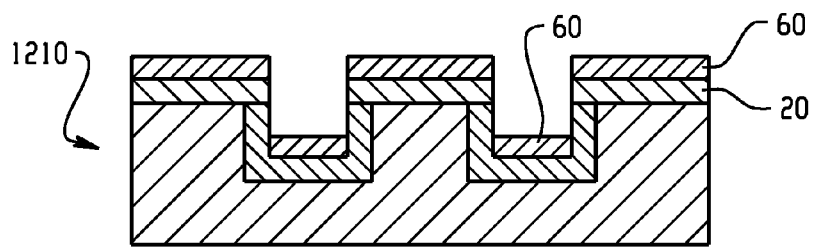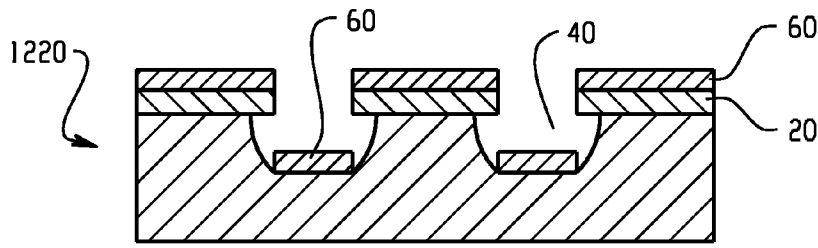
Fig. 11
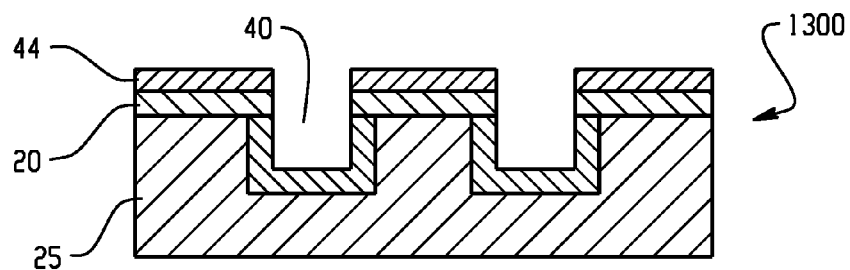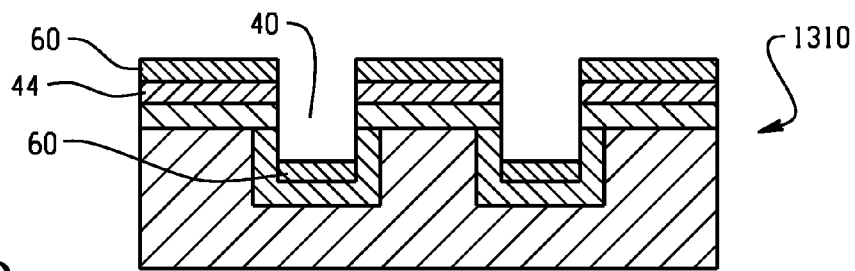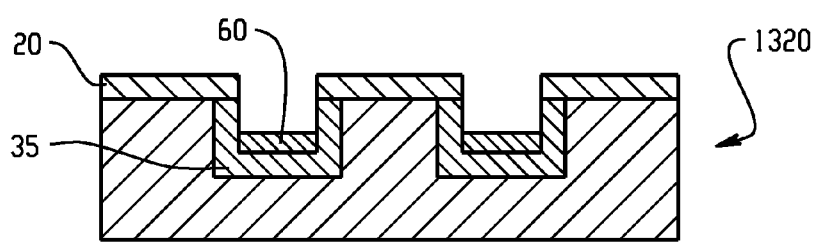
Fig. 12

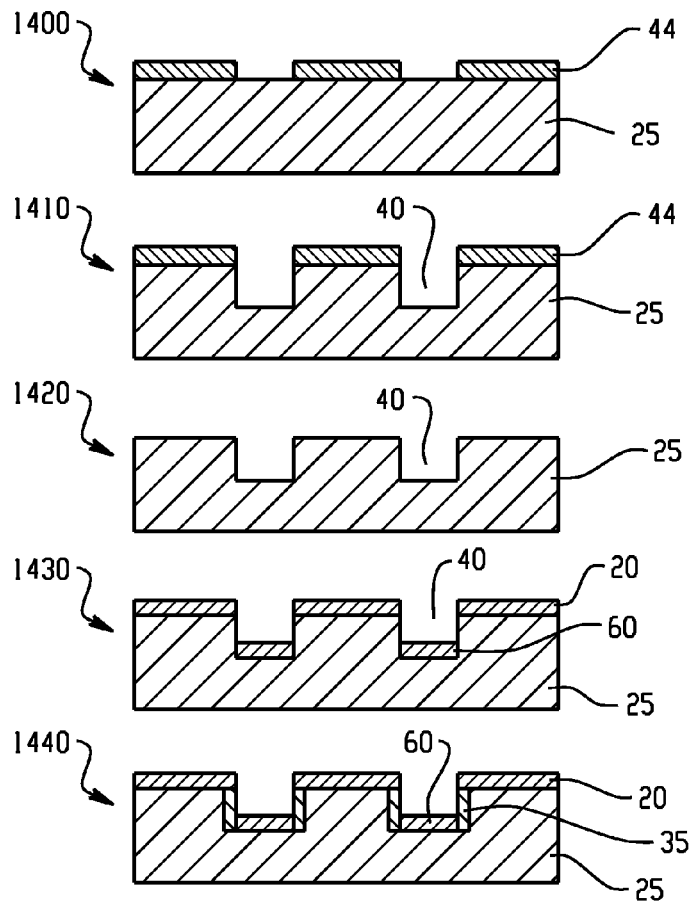
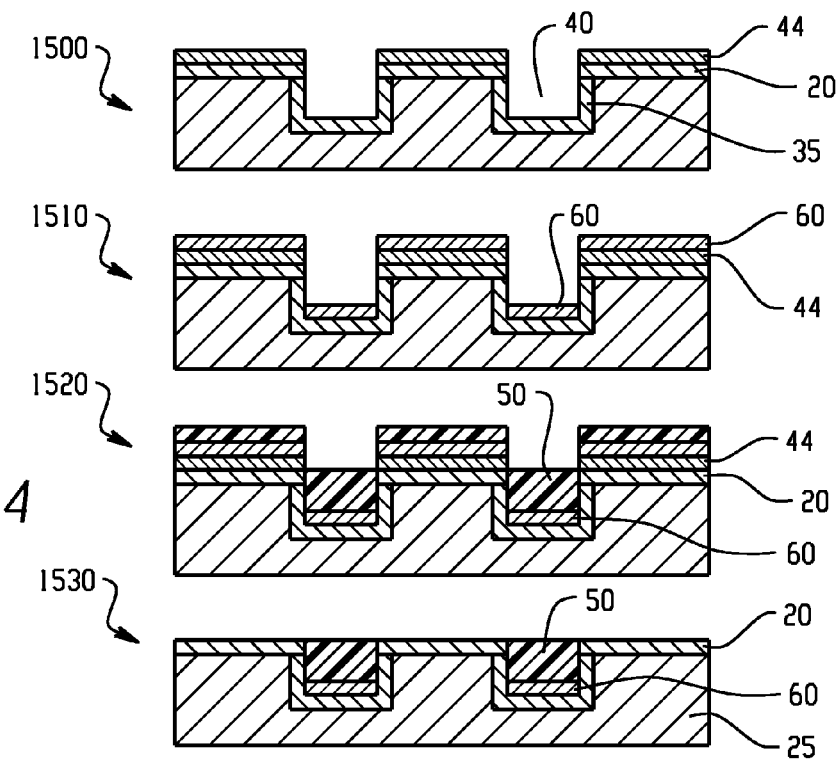

PERFORMANCE SOLID STATE DETECTORS

CROSS REFERENCE TO RELATED APPLICATIONS

This application claims the benefit of U.S. provisional application Ser. No. 60/596,314 filed Sept. 15, 2005, which is incorporated herein by reference.

DESCRIPTION

The present invention relates to detectors for medical imaging devices, and more specifically, to improved performance solid state detectors by reducing leakage of electrons to undesired positions, such as from pixel to pixel, from bulk to interpixel gap or from bulk to the wrong pixel.

In medical imaging apparatuses, X-rays or gamma rays are transmitted or emitted from a source and detected by a detector. Detectors generally include materials for converting the x-ray or gamma ray radiation into electrical signals. One of the most promising and widely used materials is a cadmium, zinc, tellurium alloy (CdZnTe or more generally, CZT). When x-ray or gamma ray radiation strikes the CZT material, electrons are produced. In order to retrieve the amount and location of the electrons generated, patterned electrodes are placed on the surface of the material.

One problem that sometimes affects the performance of the CZT detector is electrons sometimes "leak" or move from electrode to electrode due to the conductivity of the CZT material. This crosstalk between the pixellated electrodes leads to inaccurate electron location detection and loss of charge collection efficiency, which consequently leads to inaccuracies in the final image.

The problem of surface leakage in CZT detectors has been addressed by oxidizing the CZT surface with a wet chemical or an oxygen plasma, increasing the interpixel distance, or placing a negatively charged electrode grid between the pixels. Such solutions have resulted in slightly better performance and increased cost in the manufacture of the detectors. For example, the use of a negatively charged electrode grid between the pixels forces the electrons towards the positively biased pixels. However, in order to avoid charge loss between the pixels, the width of the grid and the distance from the grid to the pixel needs to be minimized, while maintaining a large enough distance between the pixels and the grid to ensure good separation and good manufacturability.

Another problem with existing solid-state detectors is that the electrodes do not adhere well to the conversion materials, such as CZT. Poor adhesion between the electrodes and the CZT may lead to reduced electrical and spectral performance, degradation in time due to deterioration of the contract properties, and reliability problems during module assembly and/or operation due to contact delamination.

As such, it is desirable to provide a detector with an electrode arrangement that solves the surface leakage problem without increasing the cost of the detector by requiring additional structures. It is further desirable to provide a detector in which the electrodes adhere to the CZT material.

The present invention is directed to an imaging detector that reduces the leakage between electrodes. In one embodiment, the detector is formed from a direct conversion material and metal electrodes that are separated by trenches formed in the direct conversion material. The trenches increase the distance of the conductance path between electrodes, thereby reducing the surface leakage between electrodes, without reducing the area coverage.

In some embodiments an electrode grid is disposed between the electrodes. The electrode grid is located on a different plane than the electrodes, thereby allowing the distance between electrodes to be minimized.

In some embodiments, patterned electrodes are used, wherein the electrodes partially adhere to the conversion material and partially adhere to a passivation layer, such as a dielectric material.

In the accompanying drawings, which are incorporated in and constitute a part of this specification, embodiments of the invention are illustrated, which, together with a general description of the invention given above, and the detailed description given below serve to illustrate the principles of this invention. One skilled in the art should realize that these illustrative embodiments are not meant to limit the invention, but merely provide examples incorporating the principles of the invention. In addition, the various embodiments may be combined, for example to obtain detectors with passivation layers and trenches or detectors with passivation layers and electrode grids.

FIGS. 7A and 7B illustrate a prior art detector with a grid electrode.

FIGS. 8A and 8B illustrate an embodiment of a detector that includes trenches and a grid electrode.

FIG. 11 illustrates another method of making a detector that includes trenches and a grid electrode.

FIG. 12 illustrates another method of making a detector that includes trenches and a grid electrode.

FIG. 13 illustrates another method of making a detector that includes trenches and a grid electrode.

FIG. 14 illustrates another method of making a detector that includes trenches a grid electrode and filling of the trenches.

FIG. 15b illustrates a top view of the detector embodiment shown in FIG. 15a.

FIG. 16b illustrates a top view of the detector embodiment shown in FIG. 16a.

The detector disclosed herein provides an improved electrode arrangement that reduces electron surface leakage. The electrodes on the surface of the CZT material have a greater distance between them, without decreasing the pixel size. A trench is made between the electrodes thereby increasing the path an electron must travel in order to pass from one electrode to another. In addition some embodiments include a grid of negatively charged electrodes that can be placed in the trenches to prevent electrons from accumulating in the interpixel gaps or at the wrong pixel. In some embodiments, passivation layer is used to provide improved adhesion of the electrodes to the conversion material or to shield the electrodes from grid electrode structures.

Figure 1:
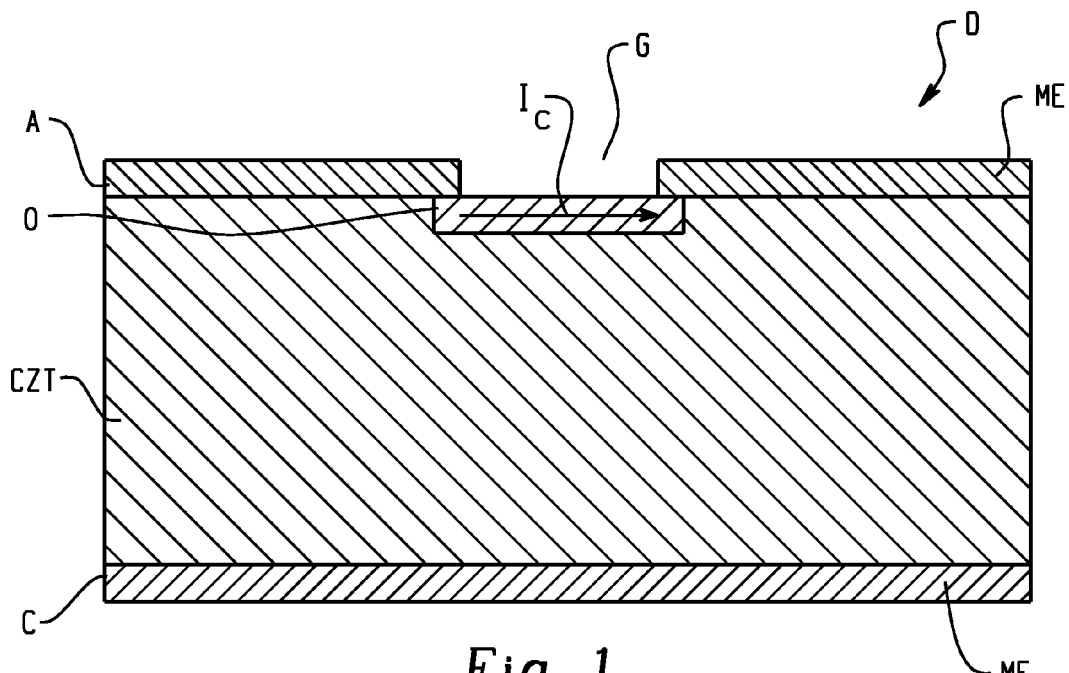
FIG. 1 illustrates a prior art detector.

FIG. 1 illustrates a prior art detector arrangement D. Metal electrodes ME are placed on either side of the CZT material CZT, thereby forming an anode side A and a cathode side C. The electrodes on the anode side are separated by a gap G of oxidized CZT O. When a charge difference is present between the electrodes (the electrode on the top as shown in FIG. 1), the charge can flow across the oxidized CZT gap O, shown as $I_c$ to the other electrode. The leakage of electrons from one electrode to another creates imaging inaccuracies. Alternatively when electrons are generated in the bulk of the CZT by radiation, these can flow to the wrong pixel or end up in the interpixel gaps, thereby leading to imaging inaccuracies and loss of imaging information.

Figure 2:
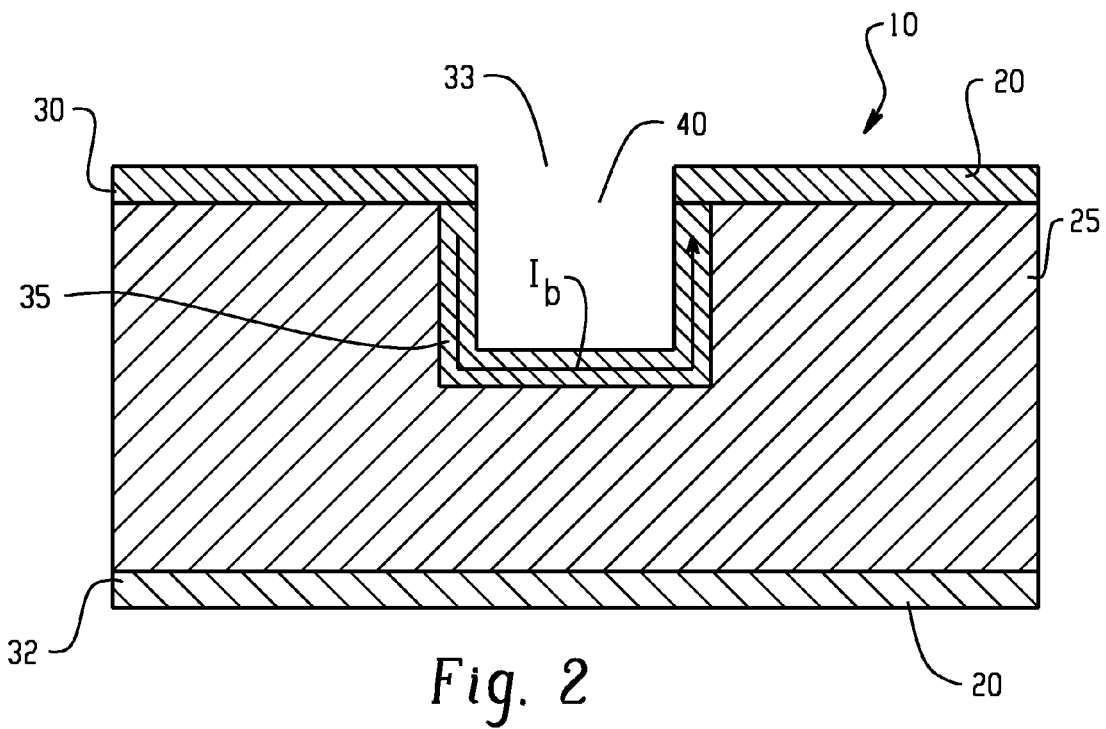
FIG. 2 illustrates an embodiment of a detector that includes trenches separating the electrodes.

FIG. 2 illustrates an embodiment of the present invention, wherein the electrodes are separated by trenches. The detector 10 includes metal electrodes 20 located on either side of a direct conversion material 25, such as CZT material, to form an anode side 30 and a cathode side 32. The direct conversion material 25 can be any appropriate material, including, but not limited to selenium, mercury iodide, lead oxide, lead iodide, thallium bromide, bismuth iodide, gallium arsenide or other suitable material. Depending on the application, the direct conversion material can be replaced with a scintillator, or any other suitable materials for the conversion of radiation directly or indirectly into electrons. It should be appreciated that the more conductive materials have a higher surface leakage between electrodes potential. Furthermore, it should be appreciated that the concepts described in this application should not be limited to any particular material composition. Such materials are merely listed as illustrative examples.

The electrodes 20 on the anode side 30 are separated by a gap 33 of oxidized material 35. It should be noted that oxidized material is merely an illustrative example of a passivation of the material within the gap 33. Other passivation means are also contemplated in this application. The gap 33 forms a trench 40, that elongates the path $I_b$ an electron must take in order to move from electrode to electrode. The trench 40 effectively increases the conductive path $I_b$ between the electrodes 20, but the lateral distance between the electrodes 20 remains the same. This means that the lateral distance and area coverage of the electrodes 20 can be used to optimize the resolution and charge collection efficiency, while the trenches 40 reduce the surface leakage. The depth of the trench 40 can be varied to achieve an optimal result. As an example, by creating trenches 40 that have a depth roughly equal to one half of the lateral distance between the electrodes 20, the conductive path $I_b$ distance is doubled. In the case where the depth is equal to the lateral distance between the electrodes 20, the conductive path $I_b$ distance is tripled.

Figure 3:
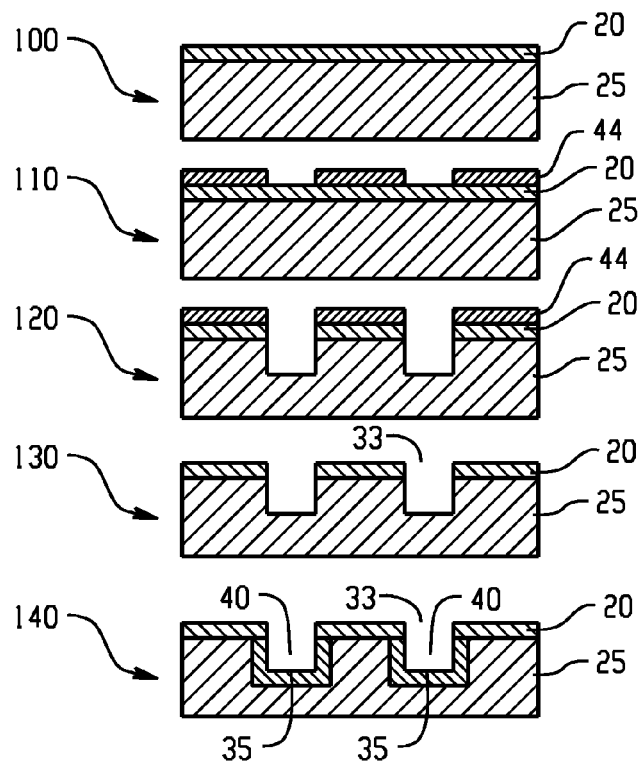
FIG. 3 illustrates a method of making the detector embodied in FIG. 2.

FIG. 3 illustrates one method of making the detector 10 shown in FIG. 2. As shown at 100, electrode metal 20 is deposited across a surface of the direct conversion material 25. At 110, a photoresist material 44 is applied and baked to the electrode metal 20 and then exposed through a photomask to define the electrode pattern. The photoresist material 44 is then removed from the interpixel areas. At 120, the electrode metal 20 and direct conversion material 25 are etched in the interpixel areas, or gaps, 33 to form trenches 40. At 130, the resist material 44 is stripped and cleaned away from the electrode metal 20, thereby exposing pixellated electrodes 20. Finally, at 140, the surfaces of the trenches 40 are oxidized to form a passive layer of oxidized material 35, such as oxidized CZT.

Figure 4:
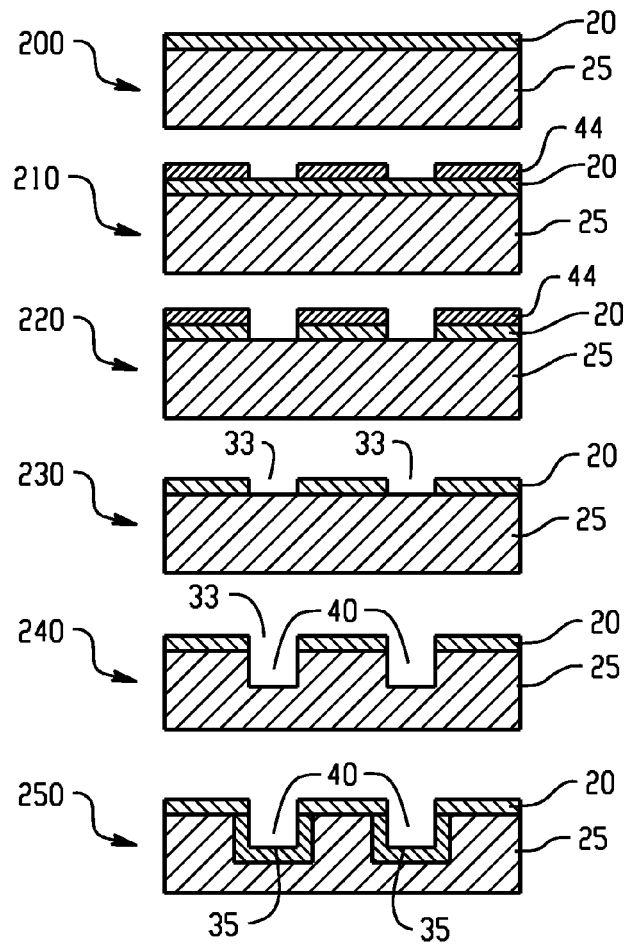
FIG. 4 illustrates another method of making the detector embodied in FIG. 2.

FIG. 4 illustrates a second method for making the detector 10 shown in FIG. 2. At 200, electrode metal 20 is deposited across a surface of the direct conversion material 25. At 210, a photoresist material 44 is applied and baked to the electrode metal 20 and then exposed through a photomask to define the electrode pattern. The photoresist material 44 is then removed from the interpixel areas. At 220, the metal 20 is etched to form pixellated electrodes 20. At 230, the resist material 44 is stripped and cleaned away from the electrode metal 20, thereby exposing pixellated electrodes 20. At 240, the material 25 is etched to form trenches 40. In some embodiments, steps 230 and 240 could also be carried out in reverse order. Finally, at 250, the surfaces of the trenches 40 are oxidized to form a passive layer of oxidized material 35, such as oxidized CZT. While this method adds a step since the metal and direct conversion material are etched in separate steps, this method does have some advantages. First, since the metal and direct conversion material are etched in separate steps, each etching step 220, 240 can be optimized. Second, the metal etching forms a mask for the etching of the direct conversion material.

The method described in FIG. 4 can also be applied to detectors where the patterned electrodes are formed in a different way, including pattern-wise deposition, lift off processes, printing, transfer techniques, followed by subsequent trench etching and passivation using the metal as a mask (steps 240-250).

Figure 5:
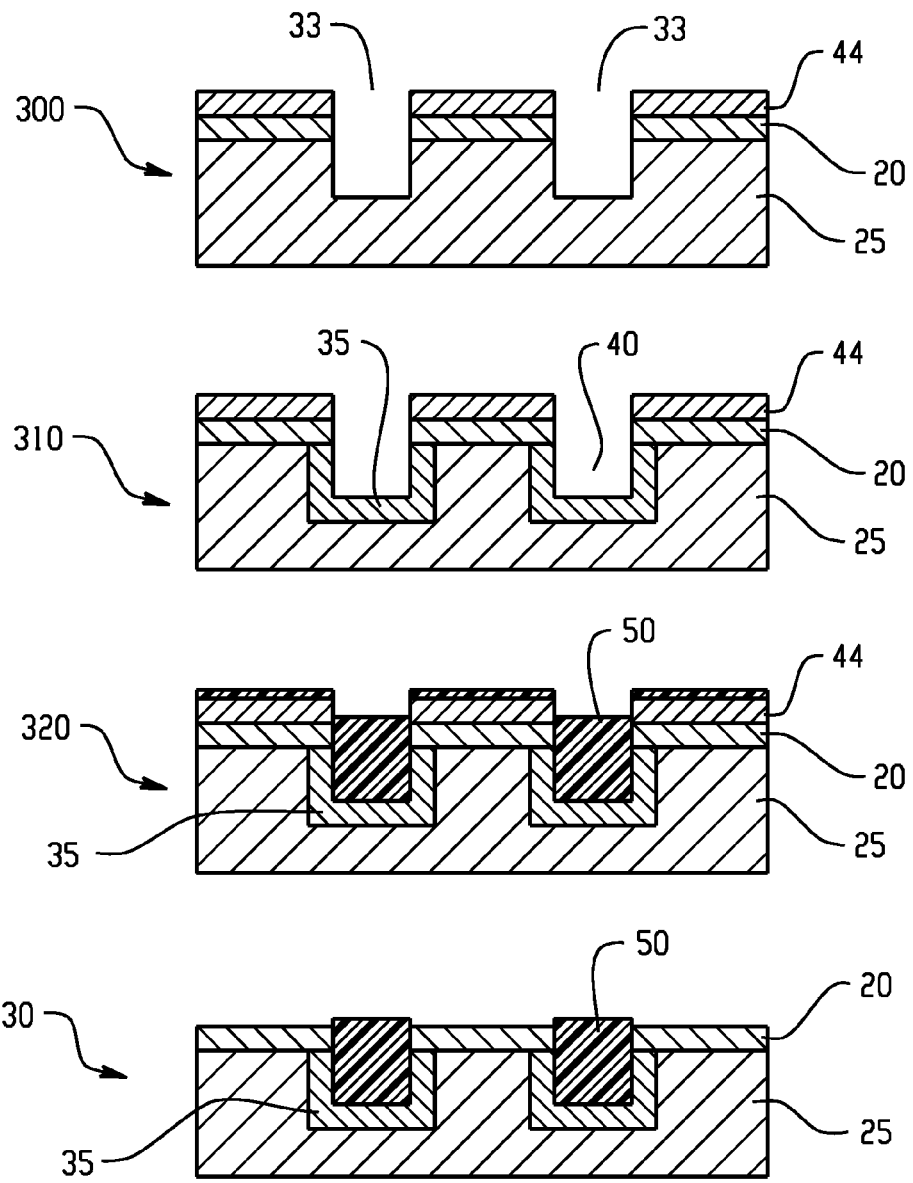
FIG. 5 illustrates a method of making another embodiment of a detector that includes filling of trenches separating the electrodes.

FIG. 5 illustrates another method of forming another embodiment of a detector. At 300, the method has occurred as described in 100 through 120 in FIG. 3. At 310, the surfaces of the trenches 40 are oxidized to form a passive layer of oxidized material 35, such as oxidized CZT. At 320, the trenches 40 are filled with a dielectric material 50, such as, for example photoresist, BCB, SU-8, PI, silicon oxide, silicon nitride, aluminum oxide, or other appropriate material. The dielectric material 50 shields the interpixel areas from the environment and reduces coupling between the pixels. The dielectric material 50 may also assist in the bonding to the read out electronics, e.g. via a board (not shown). Finally, at 330, the resist material 44 is stripped and cleaned away from the electrode metal 20, thereby exposing pixellated electrodes 20.

Methods that form the dielectric material 50 after the trenches 40 have been formed and a passivation coating has been applied can also be used. Such methods can include application by conventional lithography and etching, application of a photosensitive material followed by exposure and development to define a pattern, or selective application of material, such as by ink-jet or other printing techniques.

Figure 6:
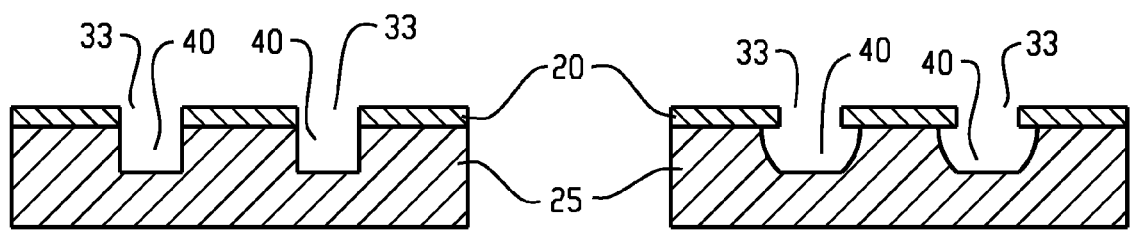
FIG. 6 illustrates two different trench profiles obtained by different etching methods that can be used in any embodiment of making any embodiment of the detector within the scope of this application.

FIG. 6 illustrates different types of etching. On the left, a detector is shown after anisotropic (dry) etching. The trenches 40 formed by anisotropic etching include fairly squared-off edges. On the right, a detector is shown after isotropic etching (wet or dry). The trenches 40 formed by isotropic etching include fairly rounded edges, thereby forming more of a bowl-shaped trench. It should be appreciated that either type of etching can be used in any of the described embodiments, or in any embodiment within the scope of this application.

The detector described herein can be used in any imaging apparatus and has particular application in medical imaging apparatuses. Such imaging apparatuses typically include an imaging area, one or more detectors and an image processor.

FIGS. 7A and 7B illustrate a prior art detector D' that incorporates a negatively charged electrode grid G located between the metal electrodes ME. The grid G forces the electrons towards the positively biased electrodes. However, in order to avoid charge loss between the pixels, the width of the grid and the distance from the grid to the metal electrodes ME should be minimized. In addition, the distance $d_c$ between the metal electrodes ME should be minimized to ensure good surface coverage. However, as noted above, the short distance between the metal electrodes ME allows electrons to leak through the conductive CZT material.

As shown in FIGS. 8A and 8B, a grid 60 can be placed in the trenches 40 described above. By placing the grid 60 in trenches 40, the distance $d_b$ between the electrodes 20 can be less than that of the prior art distance $d_c$. This reduced distance $d_b$ provides for between surface coverage and therefore improves the charge collection efficiency. In addition, as described above, the trenches 40 elongate the conductive path through the direct conversion material 25, thereby reducing electron leakage.

Figure 9:
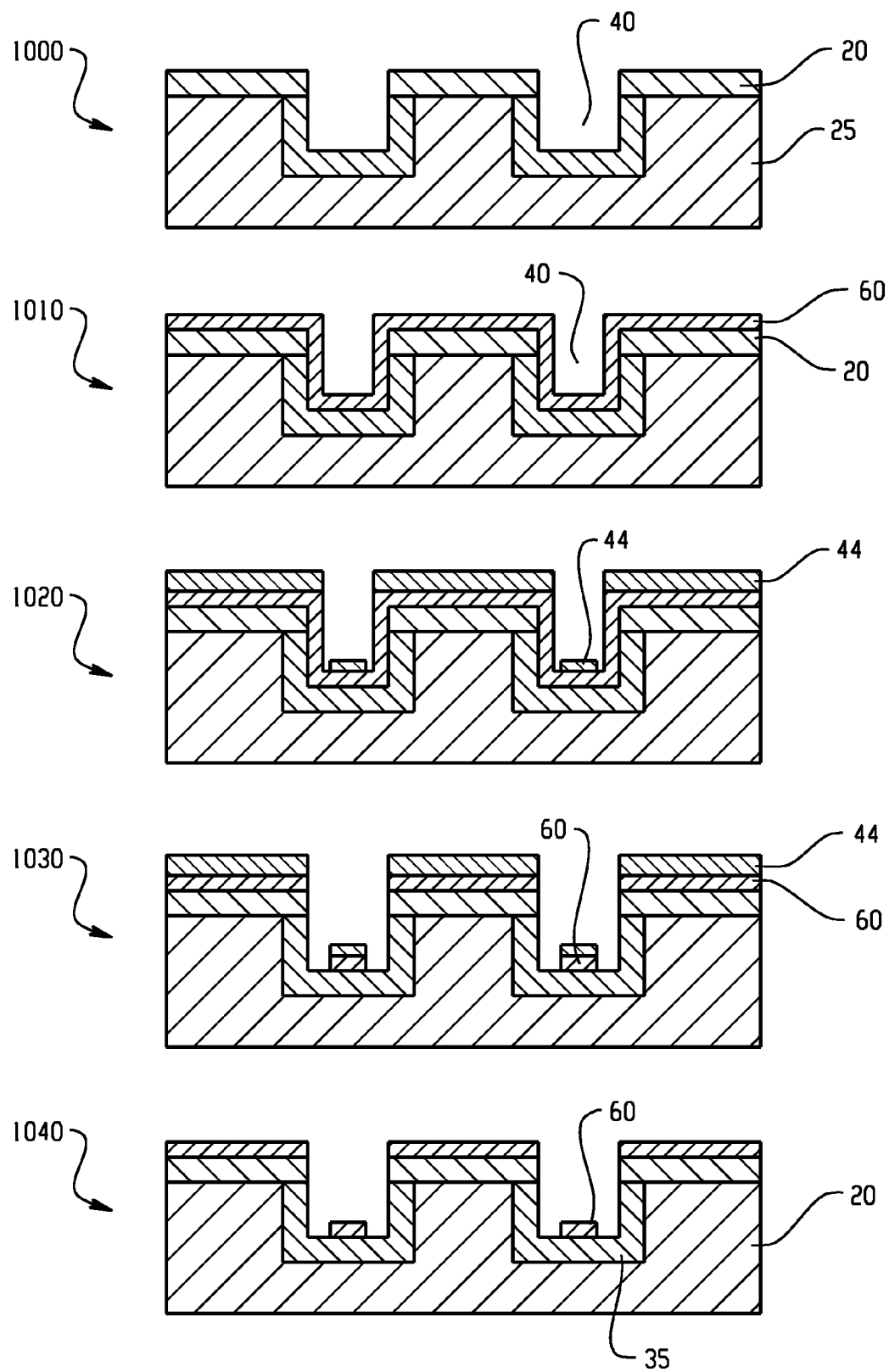
FIG. 9 illustrates a method of making a detector that includes trenches and a grid electrode.

FIG. 9 illustrates one method of making a detector 10 that includes both trenches 40 and a negatively charged electrode grid 60. This method starts at 1000 with a detector arrangement such as shown at 140 in FIG. 3 or at 250 in FIG. 4. At 1010 grid electrode material 60 is deposited across the surface of the electrodes 20 and trenches 40. At 1020 resist material 44 is applied and patterned over the electrodes 20 and a defined area within the trenches 40 that will form the grid 60. At 1030 the grid electrode material 60 is etched from the non-resist covered areas. At 1040 the resist material 44 is removed. As shown at 1040, the resulting detector arrangement includes electrodes 20 separated by trenches 40 that contain a grid 60 therein. The trenches 40 are shown with the optional passivation layer 35. This method allows for the grid structure to be defined independently from the pixel electrode structure. Depending on the materials used and the resist pattern, the grid electrode material may be present on or removed from the pixel electrodes.

Figure 10:
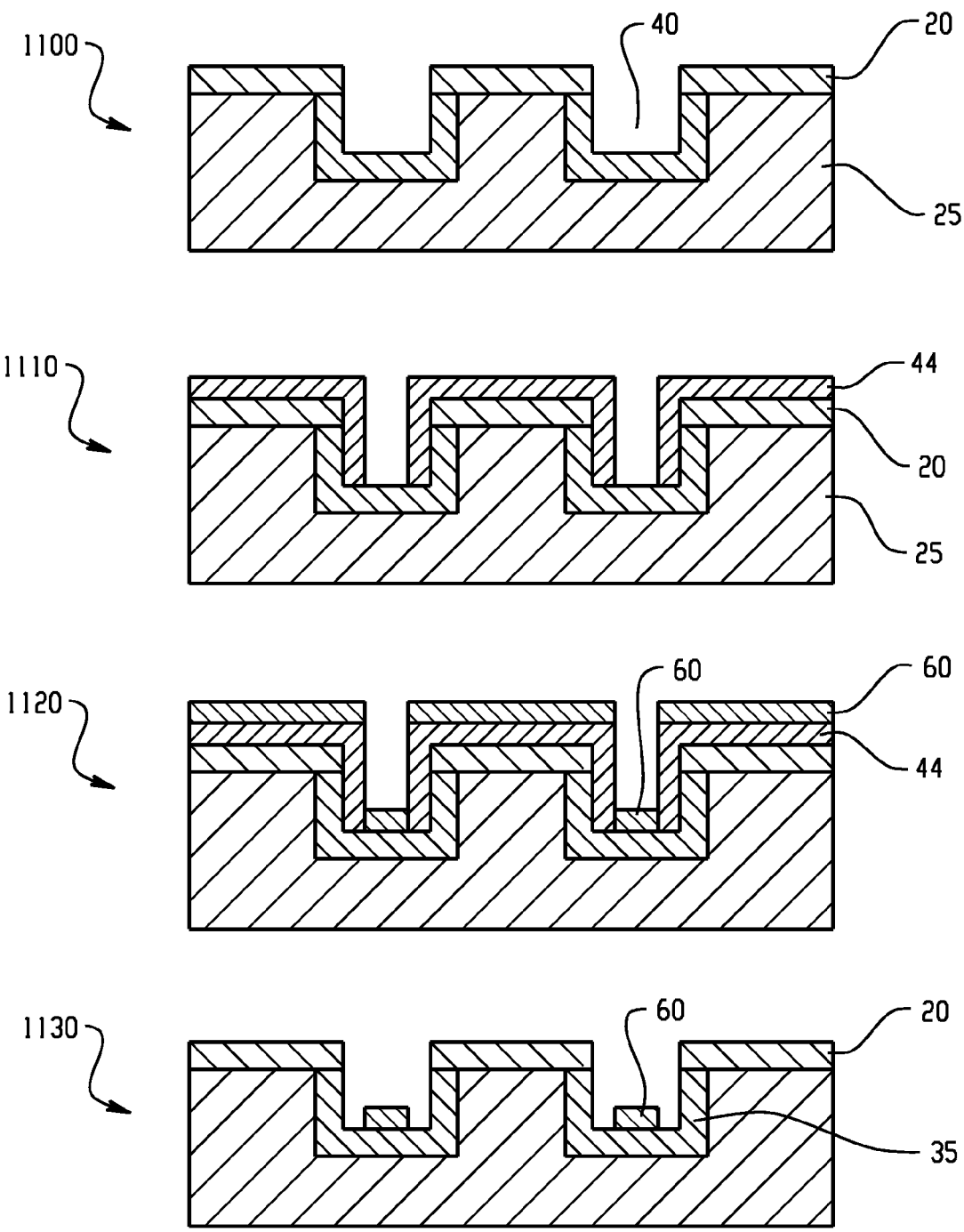
FIG. 10 illustrates another method of making a detector that includes trenches and a grid electrode.

FIG. 10 illustrates another method of making a detector 10 that includes both trenches 40 and a negatively charged electrode grid 60. As with the method illustrated in FIG. 9, this method starts at 1100 with a detector arrangement such as shown at 140 in FIG. 3 or at 250 in FIG. 4. At 1110 resist material 44 is applied and patterned over the electrodes 20 and within the trenches 40 except for a defined area that will form the grid 60. At 1120 grid electrode material 60 is deposited along the surface. At 1130 resist material 44 is striped off, which also removes any grid electrode material 60 that was deposited on the resist material. As shown in 1130, the resulting detector arrangement includes electrodes 20 separated by trenches 40 that contain a grid 60 therein. Again, the trenches 40 are shown with the optional passivation layer 35. This method is similar to that shown in FIG. 9, except that it has one less step, as the etching step is omitted.

FIG. 11 illustrates another method of making a detector 10 that includes both trenches 40 and a negatively charged electrode grid 60. This method starts at 1200 with a similar detector arrangement as the starting point for the previous two methods. At 1210 grid electrode material 60 is deposited along the electrode 20 surfaces and along the bottom of the trenches 40. A deposition technique that does not allow for material to be deposited along the sidewalls of the trenches is used. Again, passivation is an optional step. This method is advantageous in that it does not require additional mask steps. However, this process can be more critical, especially for shorts between pixel and grid electrodes. This can be alleviated by optimizing the pixel electrode and trench shape. As shown at 1220 the trenches 40 are etched to change the shape of the trenches, thereby improving the electrode separation.

FIG. 12 illustrates an "integrated" method of forming a detector 10 arrangement with trenches 40 separating electrodes 20 and a negatively charged electrode grid 60 disposed within the trenches 40. This method starts at 1300 with a detector arrangement including electrodes 20 separated by trenches 40 and resist material 44 already present, but only to the electrodes 20. This is an intermediate stage in the trench formation as e.g. described at 120 in FIG. 3 and at 320 in FIG. 5. At 1310 grid electrode material 60 is deposited on the electrodes 20 and along the bottom of the trenches 40, which is similar to the method shown in FIG. 11. At 1320 the resist material 44 is striped away, thereby removing the grid electrode material 60 that was deposited on the electrodes 60. As shown at 1320, the detector arrangement includes trenches 40 between the electrodes 20 with a grid 60 disposed within the trenches.

FIG. 13 illustrates another method of making a detector 10 that includes both trenches 40 and a negatively charged electrode grid 60, which includes definition of pixel and grid electrodes after making of the trenches. This method begins at 1400 wherein the resist material 44 is applied and patterned on the surface of the direct conversion material 25. At 1410 the direct conversion material 25 is etched to form trenches 40. At 1420 the resist material 44 is striped away. At 1430 electrode material is deposited along the horizontal surfaces along the face of the direct conversion material 25. The electrode material thus forms electrodes 20 along the top surface and electrode grid 60 within the trenches 40. At 1440 an optional passivation layer 35 is applied to conductive path between the electrodes 20.

FIG. 14 illustrates one additional method of forming a detector 10 that includes both trenches 40 and a negatively charged electrode grid 60. This method begins at 1500 with trenches 40 formed in the direct conversion material 25, an optional passivation layer 35 applied to the conductive path between electrodes 20, and resist material 44 disposed on the electrodes 20. At 1510, grid electrode material 60 is deposited on the bottom of the trenches 40 and on the resist material 44. At 1520 dielectric material 50 is deposited across the surface of the detector thereby filling the trenches 40. At 1530 resist material 44 is striped away from the electrodes 20, thereby removing any grid electrode material 60 and dielectric material 50 that was deposited on the resist material 44. The detector arrangement, as shown at 1530, includes electrodes 20 separated by trenches 40 filled with dielectric material 50. The dielectric material 50 encloses the grid 60.

The dielectric material can also be applied by other means, such as lithography or printing techniques, similar to the example described in FIG. 5.

In some embodiments, patterned electrodes 20' can be used to improve the adhesion between the electrodes and the conversion layer 25. The patterned electrodes 20' partially adhere to the conversion layer 25 and partially adhere to a passivation layer 50. The passivation layer 50 provides for improved adhesion between the conversion layer and the electrodes. Furthermore, the passivation layer improves the protection of the conversion layer-electrode contacts, which reduces the chance of degradation by oxygen and moisture. As in other embodiments, the passivation layer also reduces current leakage, thereby reducing crosstalk. Furthermore, the passivation layer can be used as a barrier between the surface electrodes and grid electrode structures.

Materials that can be used as passivation layers include, but are not limited to dielectric materials such as photoresist, BCB, SU-8, PI, silicon oxide, silicon nitride, aluminum oxide, or other appropriate material.

Such embodiments may provide an additional benefits in the ease of electrical testability. When a testprobe is contacted to the electrode on the top of the passivation material, no damage to the conversion layer can occur.

Figure 15A:
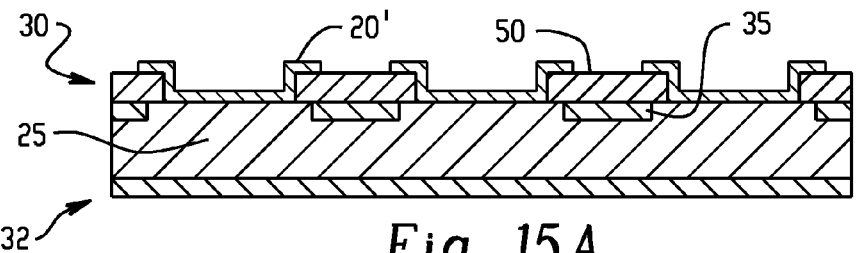
FIG. 15a illustrates an embodiment of a detector including patterned electrodes that partially adhere to the direct conversion material and partially adhere to a passivation layer.
Figure 15B:
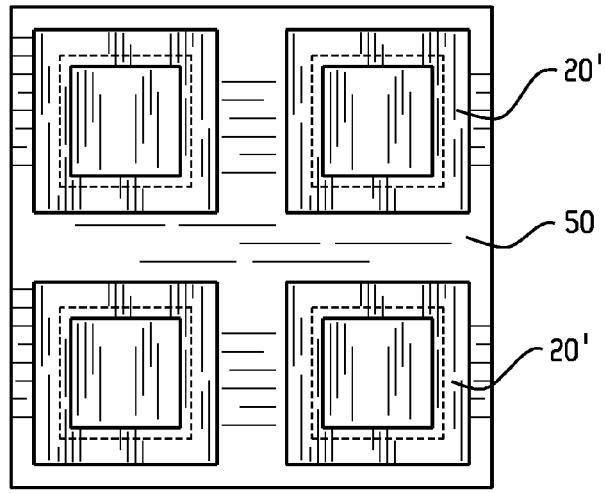

FIG. 15a illustrates an embodiment which uses patterned electrodes 20' on the anode side 30. In such an embodiment, the patterned electrodes 20' partially adhere to the conversion layer 25 and partially adhere to a passivation layer, such as a dielectric material 50. The embodiment in FIG. 15a illustrates an optional oxidation layer 35 between the patterned electrodes 20'. FIG. 15b illustrates a top view of the embodiment illustrated in FIG. 15a.

Figure 16A:
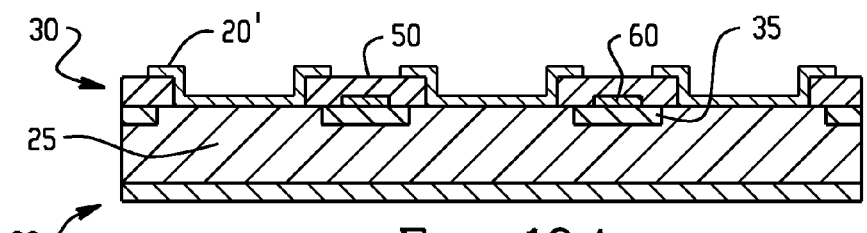
FIG. 16a illustrates an embodiment of a detector including patterned electrodes and an electrode grid.
Figure 16B:
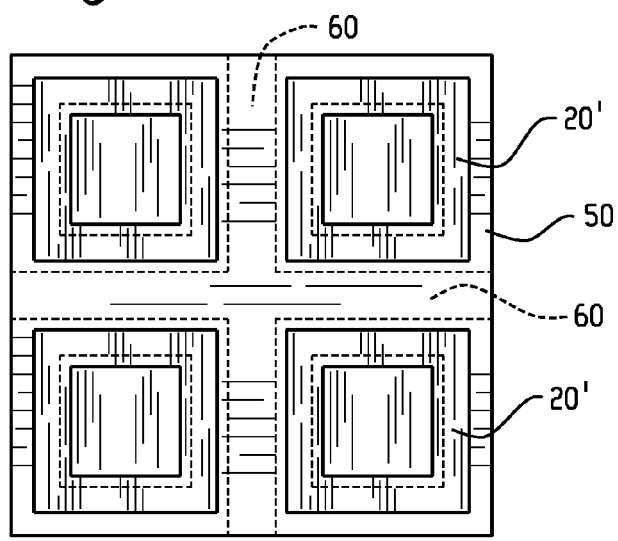

FIG. 16a illustrates an embodiment similar to that which is illustrated in FIG. 15a, except that an electrode grid 60 has been added between the patterned electrodes 20'. The electrode grid 60 can be used to further reduce crosstalk between the patterned electrodes 20' and to improve the charge collection efficiency by directing the electrons to the positively charged electrodes. FIG. 16b illustrates a top view of the embodiment illustrated in FIG. 16a.

Figure 17:
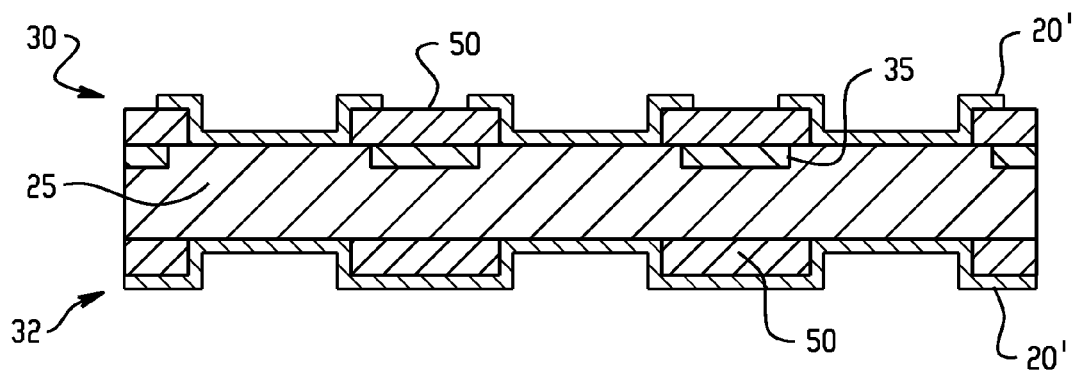
FIG. 17 illustrates a detector embodiment with patterned electrodes on both anode and cathode sides.
Figure 18:
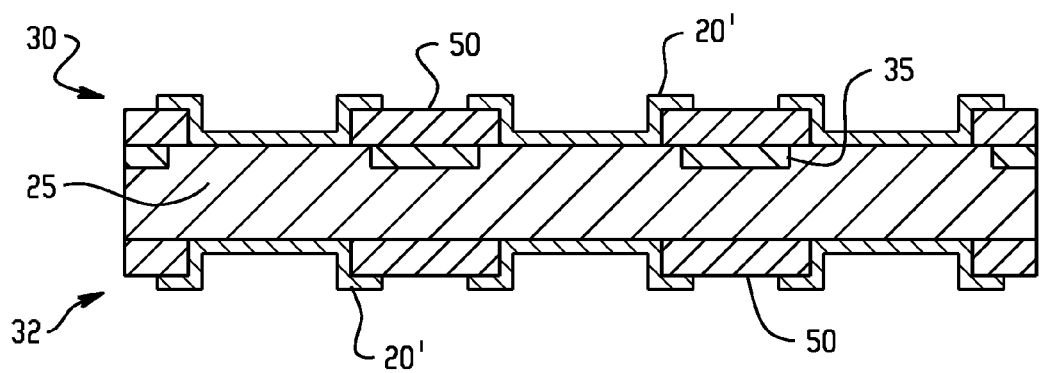
FIG. 18 illustrates another detector embodiment with patterned electrodes on both anode and cathode sides.
Figure 23:
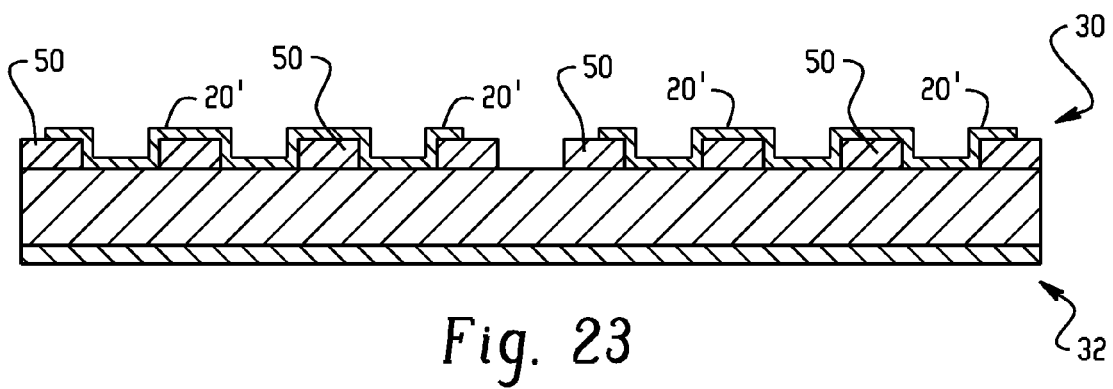
FIG. 23 illustrates an embodiment of a detector including patterned electrodes and a passivation layer, having a different pattern than the electrodes.

It should be noted that the use of patterned electrodes 20' can occur on either the anode side 30, the anode side 32, or on both sides, such as the embodiments shown in FIGS. 17 and 18. Furthermore, it should also be appreciated that pattern or geometrical shape of the patterned electrodes 20' can be varied. For example, the patterned electrodes shown in FIGS. 15-18 are generally squared or rectangular. However, any pattern or geometry can be adapted such that the patterned electrodes 20' partially adhere to the conversion layer 25 and partially adhere to the passivation layer 50. Moreover, the pattern of the passivation layers and the electrodes do not need to be identical: an example of different patterns and sizes is shown in FIG. 23.

Figure 19:
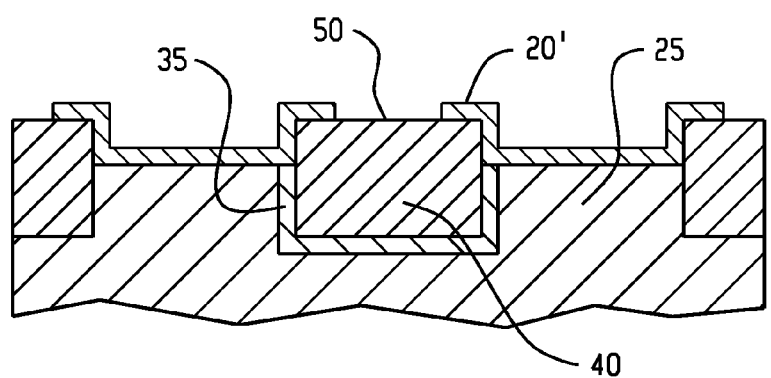
FIG. 19 illustrates a detector embodiment including patterned electrodes and trenches separating the patterned electrodes.

FIG. 19 illustrates a detector embodiment including patterned electrodes 20' and trenches 40 separating the patterned electrodes. The patterned electrodes 20' partially adhere to the conversion material 25 and partially adhere to the passivation layer 50 that fill the trenches 40, in a similar manner as in the embodiment shown in FIG. 5. An optional oxidation layer 35 can be included along a portion of the conductive path between the patterned electrodes 20'. As with other embodiments, an electrode grid (not shown) may also be included.

Figure 20:
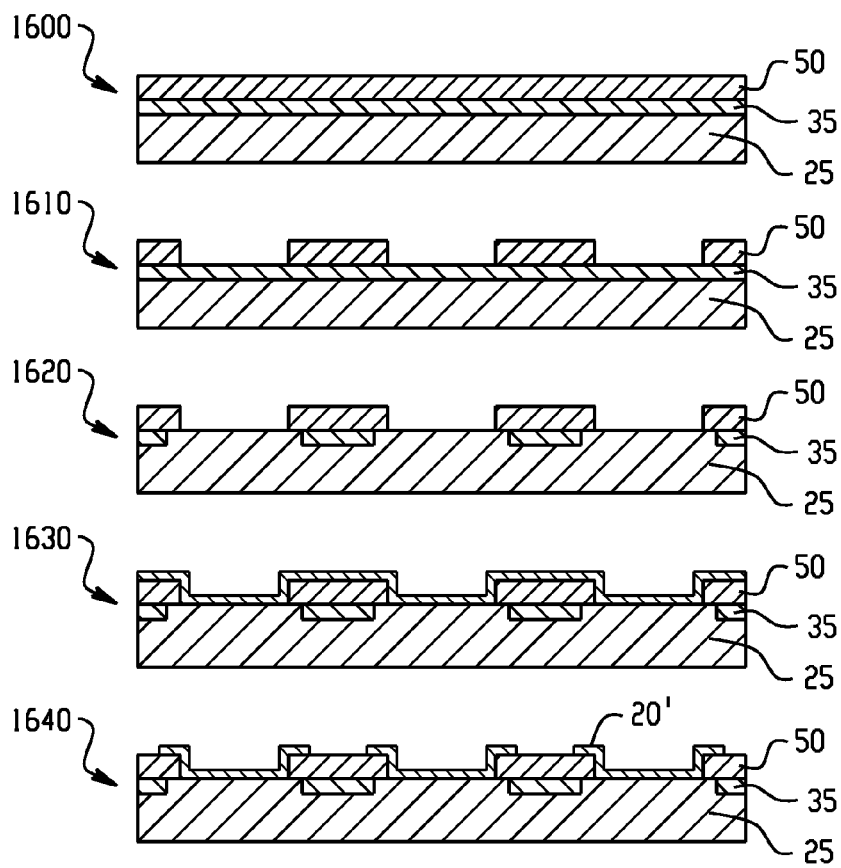
FIG. 20 illustrates an exemplary method of making a detector with patterned electrodes and an oxidation layer.

FIG. 20 illustrates an exemplary method of making a detector which includes patterned electrodes 20'. At 1600 a CZT layer, or other conversion layer, 25 is provided with an oxidation layer 35 and a passivation layer 50. At 1610 the passivation layer 50 is patterned. At 1620 surface etching removes the exposed oxidation layer 35, which is located between the patterned passivation layer 50. At 1630 electrode metal is applied. At 1640 the electrode metal is patterned to form the patterned electrodes 20'. Patterning of the electrode metal can be done in various ways, including, but not limited to, lithography, wet or dry etching, lift-off processes, or deposition through a shadowmask. It should be noted that embodiments, such as that illustrated in FIG. 20, that include the passivation layer 50 have the benefit that there is no issue of etching selectively with respect to the conversion layer 25.

Figure 21:
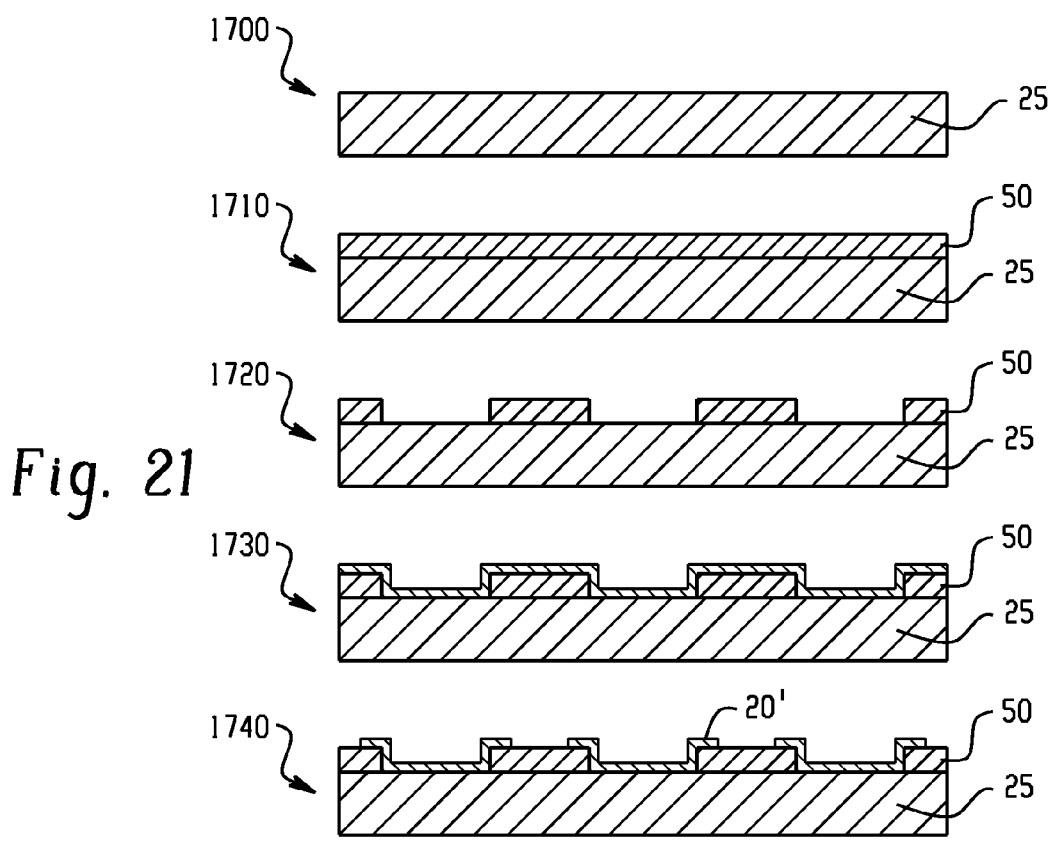
FIG. 21 illustrates an exemplary method of making a detector with patterned electrodes.

FIG. 21 illustrates another exemplary method of making a detector with patterned electrodes 20'. At 1700, a conversion layer 25 is provided and a surface etch removes the oxide layer. At 1710 the passivation layer 50 is applied. At 1720 the passivation layer is patterned. At 1730 electrode metal is applied and at 1740 the electrode metal is patterned. Generally, this method is similar to that which is shown in FIG. 20, except that the surface etching to remove the oxide layer is done prior to application of the passivation layer. This method may be advantageous when adhesion of the passivation layer on native CZT is better or when the passivation layer is not compatible with the surface etchant material.

Figure 22:
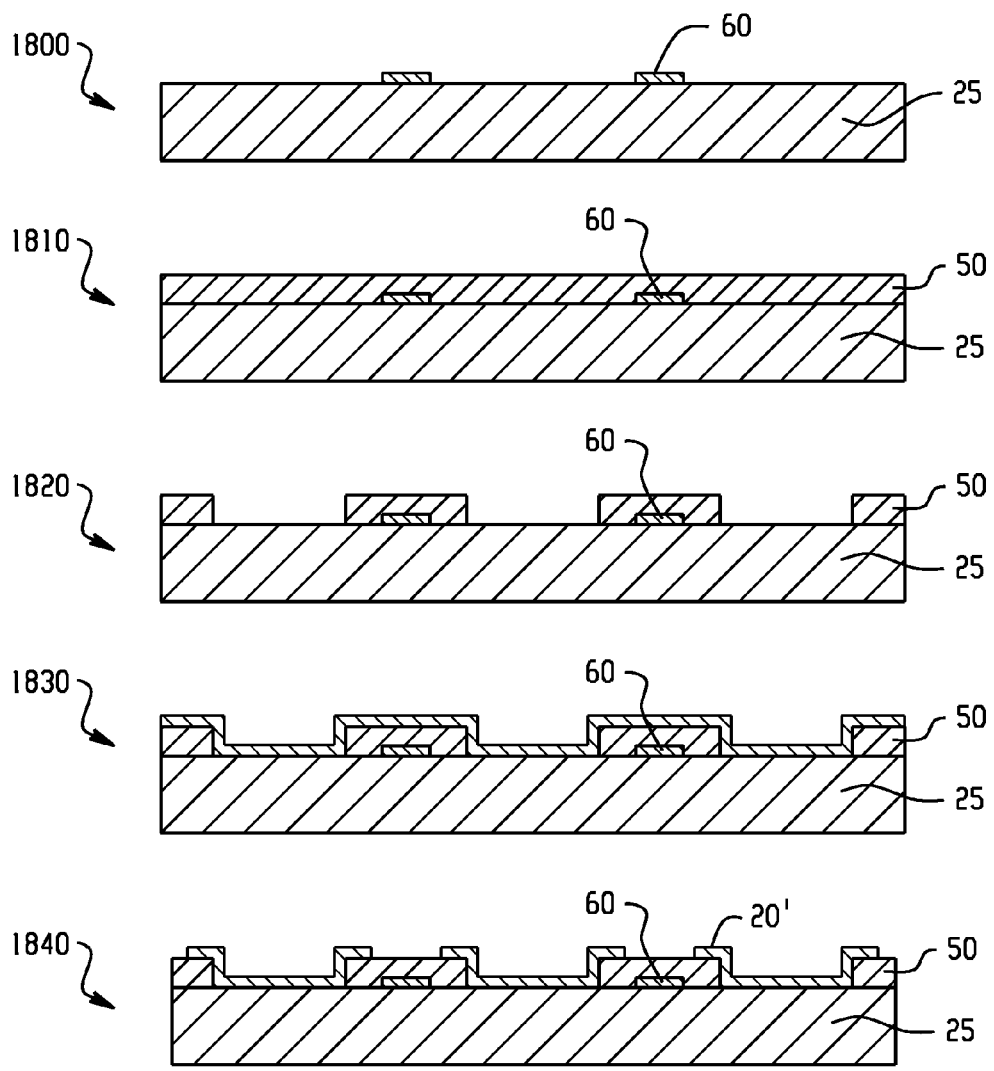
FIG. 22 illustrates an exemplary method of making a detector with patterned electrodes and an electrode grid.

FIG. 22 illustrates a further exemplary method of making a detector with patterned electrodes 20', and further including an electrode grid. At 1800 a conversion layer 25 is provided with an electrode grid 60 placed thereupon. At 1810 a passivation layer 50 is applied over the conversion layer 25 and the electrode grid 60. At 1820 the passivation layer 50 is patterned. At 1830 electrode metal is applied and at 1840 the electrode metal is patterned to form the patterned electrodes 20'.

It should be appreciated that each of the methods and detector configurations described in this application are merely illustrative examples and are not meant to limit the invention to any particular embodiment. For example, the detector configuration, or method of making a detector configuration, may or may not include a negatively charged grid, passivation or oxidized conductive layers, or passivation layer or dielectric material. It is further contemplated that combinations of the features and steps described herein are also contemplated by this application.

The invention has been described with reference to one or more preferred embodiments. Clearly, modifications and alterations will occur to other upon a reading and understanding of this specification. It is intended to include all such modifications, combinations, and alterations insofar as they come within the scope of the appended claims or equivalents thereof.

The invention claimed is:

1. An imaging detector comprising:
   a conversion material for directly or indirectly converting radiation to electrons;
   electrodes located on at least one side of the conversion material, wherein any two electrodes are separated by a distance and a trench that is formed in the conversion material; and
   wherein at least a portion of each electrode physically contacts and adheres to a passivation layer.

2. The imaging detector of claim 1, wherein a surface of each trench forms a conductive path between two electrodes.

3. The imaging detector of claim 2, wherein the conductive path between the electrodes comprises a layer of oxidized material.

4. The imaging detector of claim 2, wherein the conductive path along each trench is at least twice as long as the distance separating the two electrodes.

5. The imaging detector of claim 1, wherein at least some of the trenches are filled with a dielectric material which comprises the passivation layer.

6. The imaging detector of claim 1 further comprising an electrode grid disposed within at least some of the trenches.

7. The imaging detector of claim 1, wherein at least a portion of the electrodes partially adhere to the conversion material.

8. The imaging detector of claim 1, wherein the passivation layer which is adhered to the electrodes is located within the trench below the electrodes, such that an outer-facing surface of the electrodes is not covered by any other layer.

9. An imaging detector comprising:
a conversion material for directly or indirectly converting radiation to electrons;
electrodes positioned on at least one side of the conversion material, wherein a portion of the electrodes are separated by one or more trenches formed in said conversion material; and
an electrode grid disposed within at least a portion of the one or more of the trenches;
wherein a surface of the one or more trenches forms a conductive path between separated electrodes, said conductive path comprising a layer of oxidized material.

10. The imaging detector of claim 9, wherein the conductive path along the trench is at least twice as long as the distance between separated electrodes.

11. The imaging detector of claim 9, wherein the one or more trenches are filled with a dielectric material.

12. The imaging detector of claim 9 wherein at least a portion of the electrodes partially adhere to the conversion material and partially adhere to a passivation layer.

13. The imaging detector of claim 9, wherein an outer-facing surface of the electrodes is not covered by any other layer.

14. A method of forming an imaging detector comprising:
depositing metal on the surface of a conversion material, wherein said conversion material directly or indirectly converts radiation to electrons;
etching the metal to form gaps between metal electrodes;
etching the conversion material to form trenches between the metal electrodes;
providing a passivation layer; and
partially adhering at least a portion of the electrodes to the passivation layer, wherein the electrode portion which adheres to the passivation layer physically contacts the passivation layer.

15. The method of claim 14, wherein the etching of the metal and the etching of the conversion material are performed simultaneously.

16. The method of claim 14 wherein the passivation layer is provided at least in part along surfaces of the trenches.

17. The method of claim 14 further comprising filling the trenches with a dielectric material which comprises the passivation layer.

18. The method of claim 14, wherein the conversion material is etched to a depth that is at least one half of the distance of the gaps formed between the metal electrodes.

19. The method of claim 14 further comprising disposing an electrode grid within the trenches.

20. The method of claim 14 further comprising partially adhering the metal electrodes to the conversion material.

21. An imaging detector comprising:
a conversion material for directly or indirectly converting radiation to electrons;
a passivation layer applied to at least a portion of the conversion material; and
electrodes located on at least one side of the conversion material, wherein at least a portion of the electrodes partially adhere to the conversion material and partially adhere to the passivation layer at a point of physical contact with the passivation layer.

22. The imaging detector of claim 21 further comprising trenches formed in the conversion material between at least a portion of the electrodes.

23. The imaging detector of claim 22, wherein the passivation layer fills at least a portion of the trenches.

24. The imaging detector of claim 21 further comprising an electrode grid disposed between a portion of the electrodes.

25. The imaging detector of claim 21, including at least two different electrode patterns.

26. The imaging detector of claim 21, wherein an outer-facing surface of the electrodes is not covered by any other layer.

27. An imaging detector comprising:
a conversion material for directly or indirectly converting radiation to electrons;
a plurality of electrodes, wherein at least a portion of the electrodes include a flat portion that contacts the conversion material and a raised portion extending upwardly from the flat portion, wherein the raised portion adheres to a passivation material at a point of physical contact with the passivation material, and at least a portion of the passivation material is disposed in trenches positioned between electrodes.

28. The imaging detector of claim 27, wherein the passivation material is applied over an electrode grid.

* * * * *